United States Patent [19]

Fukutsuka et al.

[11] 4,386,970

[45] Jun. 7, 1983

[54] PRODUCTION METHOD OF COMPOUND-TYPE SUPERCONDUCTING WIRE

[75] Inventors: Toshiro Fukutsuka, Kobe; Masato Moritoki, Miki; Takao Fujikawa, Kobe, all of Japan

[73] Assignee: Kabushiki Kaisha Kobe Seiko Sho, Kobe, Japan

[21] Appl. No.: 312,967

[22] Filed: Oct. 20, 1981

[30] Foreign Application Priority Data

Oct. 20, 1980 [JP] Japan ............................. 55-146578
Oct. 20, 1980 [JP] Japan ............................. 55-146579

[51] Int. Cl.$^3$ ........................ H01L 39/00; B22F 3/16
[52] U.S. Cl. .................................. 148/11.5 P; 29/599
[58] Field of Search ................ 148/11.5 P, 11.5 F, 148/11.5 R; 29/599

[56] References Cited

U.S. PATENT DOCUMENTS

| | | | |
|---|---|---|---|
| 3,196,532 | 7/1965 | Swartz et al. | 29/599 |
| 3,290,186 | 12/1966 | Rosi et al. | 148/11.5 P |
| 3,752,665 | 8/1973 | Roy et al. | 29/599 |
| 4,202,931 | 5/1980 | Newkirk et al. | 29/599 |

*Primary Examiner*—W. Stallard
*Attorney, Agent, or Firm*—Oblon, Fisher, Spivak, McClelland & Maier

[57] ABSTRACT

The specification describes a method for producing compound-type superconducting wire of excellent mechanical and electrical properties. A green compact is first formed with copper powder and one of two metals which form a superconducting compound through a reaction therebetween. The latter metal is in a very fine hydrogenated form. The green compact is then heated in vacuo so as to dehydrogenate the hydride of the latter metal and sinter the green compact into a sintered mass. Before or after drawing the sintered mass into a wire, it is composited with the other metal of the two metals, thereby forming a composite wire. It is then subjected to a further heat treatment to cause the reaction to occur between the two metals. To improve its properties, it may be held in a high temperature, high pressure gaseous atmosphere to cause plastic deformation to occur. Since the dehydrogenation and annealing are performed in a single step, the overall process has been simplified. Since the latter metal is dispersed uniformly in the form of highly pure and ultra-fine particles in the Cu-matrix of the sintered mass, it can be drawn very smoothly into a wire and the reaction between the two metals can occur easily. The two metals may for example be Nb and Sn or V and Ga.

27 Claims, 2 Drawing Figures

PRODUCTION METHOD OF COMPOUND-TYPE SUPERCONDUCTING WIRE

BACKGROUND OF THE INVENTION

1. Field of the Invention

This invention relates to a method for producing a compound-type superconducting wire such as $Nb_3Sn$ or $V_3Ga$ superconducting wire, and more particularly it relates to a method for producing such a compound-type superconducting wire excellent in both electrical and mechanical properties from a sintered metallic mass having good working characteristics.

2. Description of the Prior Art

A superconducting material is generally formed by producing a wire containing a plurality of metals, which are capable of forming a compound having superconducting characteristics through a reaction, and subjecting the wire to a heat treatment to cause the reaction to occur between or among the metals. For example, to obtain a superconducting material of $Nb_3Sn$, a composite wire enclosing Nb wires in bronze, which is a Cu-Sn alloy, is produced first. Then, the composite wire is subjected to a heat treatment so as to cause the following reaction between the Nb wires and Sn in the bronze:

$$3Nb + Sn \rightarrow Nb_3Sn,$$

thereby forming a continuous $Nb_3Sn$ structure in the matrix of Cu(Bronze process). Or, a Sn plating is applied onto a wire made of a Cu-Nb alloy and the resulting Sn-plated wire is then subjected to a heat treatment, thereby causing the above-described reaction to occur in-situ process). Alternatively, subsequent to mixing Cu powder and Nb powder and sintering the resultant powder mixture, the resulting sintered mass is drawn into a wire and a Sn plating is applied onto the surface of the wire, followed by an application of a heat treatment so as to cause the above-described reaction to occur(Powder process). Of the above processes, the powder process is considered to be superior to the other processes in that, since pure Nb is dispersed in the form of very fine powder in the Cu-matrix, the proportion of Nb can be freely selected, its production process is relatively simple and easy, and the electrical properties of a product to be obtained are good. However, the powder process still involves many technical problems awaiting an improvement or solution.

Namely, in order to produce a $Nb_3Sn$-type super-conducting wire from a Cu-Nb green compact in accordance with the conventional powder process, powder of the hydride of Nb obtained by hydrogenating Nb powder in a flow of hydrogen gas is first of all ground further in a disk mill or the like to reduce its mean particle size to about 50 $\mu m$ or less. The thus-ground powder is heated in vacuo to carry out dehydrogenation annealing, thereby obtaining Nb powder containing oxygen in a proportion of 0.08% by weight or less. Then, the Nb powder and Cu powder are mixed together and formed under pressure by rubber-pressing or the like into a green compact. It is then extruded and drawn into a wire. A Sn plating is then applied onto the surface of the wire. Subsequently, the resulting Sn-plated wire is heated so as to diffusion anneal same and to produce $Nb_3Sn$. Such a series of steps is however accompanied by various inconvenience such as those described below:

(1) When heating the powder of the hydride of Nb in vacuo to subject same to dehydrogenation annealing, Nb powder is sintered, thereby to make the Nb powder coarse. Thus, in some instances, it becomes necessary to grind the resulting Nb powder again.

(2) It is required to carry out the dehydrogenation reaction at a relatively low temperature to avoid the occurrence of such sintering. Corollary to this, a longer reaction time is required.

(3) As the dehydrogenated Nb powder is activated at the surface thereof and thus liable to reoxidation, the workability of resulting green compact or sintered mass in subsequent steps would be lowered.

(4) Since Nb powder is extremely fine, its particles having strong tendency to form agglomerates. Thus, in order to obtain a uniform mixture of Cu powder and Nb powder, it is necessary to mix them together in a wet state by means of a ball mill or to adopt some special mixing technique. However, in the course of mixing pure Nb powder and pure Cu powder together, they are susceptible of undergoing a surface oxidation, thereby creating a problem similar to that referred to in the above item (3).

Such problems would become serious obstacles in the subsequent wire drawing step, composition step and/or reaction step between Nb and Sn, leading to deterioration of the electrical and mechanical characteristics of a resulting wire.

In addition, when Nb and Sn are caused to react with each other and a superconducting phase is thus formed by subjecting a composite wire formed of said two metals to a heat treatment, voids, which are generally called Kirkendall voids, occur inevitably in the wire due to an alteration of the atomic arrangement caused by the reaction. Furthermore, as the superconducting compound formed in the wire is not suitable for further working such as rolling or drawing after the production of the superconducting wire through the above heat treatment, it is the present state of the art that the thus-heat treated composite wire is used as a superconducting wire without applying such a subsequent working thereto, while still containing such voids. It is well-known that the presence of such voids in the superconducting wire lowers its thermal conductivity, becomes starting points of breakage of the brittle layer of said compound when stress is exerted onto the wire and also becomes a cause for deteriorated electrical properties of the wire.

However, a superconducting compound is too brittle to apply a conventionally-employed void elimination technique such as rolling or drawing after the formation thereof. Therefore, the presence of such voids is a very serious problem for compound-type superconducting wires. The present assignee has already proposed in Japanese Patent Application No. 88053/1980 filed June 27, 1980 an effective method for the elimination of such voids, in which a superconducting wire obtained through a heat treatment is held for a certain period of time in a gaseous atmosphere of a temperature and pressure sufficiently high to cause the wire to undergo plastic deformation, thereby collapsing said voids, diffusion bonding the thus-collapsed portions and producing a super-conducting wire of high density.

SUMMARY OF THE INVENTION

In view of the state of the art and problems of the prior art described above, the present invention has been completed with a view to producing a compound-type super-conducting wire having excellent electrical and mechanical characteristics by forming a composite wire or great reactivity from a sintered metallic mass having good workability, subjecting the composite wire to a heat treatment to obtain a superconducting wire, and preferably applying to the same superconducting wire the above-described void elimination method proposed by the present assignee so as to densify the superconducting wire further.

In one aspect of this invention, there is thus provided a method for producing a compound-type superconducting wire including forming a wire containing two kinds of metals which are, upon a reaction therebetween, capable of forming a compound pertaining superconducting characteristics and subjecting said wire to a heat treatment so as to cause said reaction to occur. The method comprises the steps of:

(i) mixing powder of the hydride of one of said two kinds of metals uniformly with copper powder and forming under pressure a resulting powder mixture into a green compact;

(ii) heating said green compact in vacuo so as to subject said hydride to dehydrogenation annealing, thereby forming a sintered mass;

(iii) drawing said sintered mass into a wire and compositing said wire with the other metal of said two kinds of metals to form a composite wire, or, alternatively, compositing said sintered mass with the other metal of said two kinds of metals and drawing a resulting composite sintered mass into a composite wire;

(iv) subjecting said composite wire to a heat treatment to cause said reaction to occur between said two kinds of metals.

In another aspect of this invention, there is also provided another method which is similar to the method described above as one aspect of this invention but further comprises the following additional step:

(v) holding said superconducting wire for a predetermined period of time in a gaseous atmosphere of a temperature and pressure sufficiently high to cause said superconducting wire to undergo plastic deformation, thereby collapsing voids developed in the superconducting wire during said reaction, diffusion bonding the thus-collapsed portions and densifying the superconducting wire. The application of the above additional step is very effective to obtain a final superconducting wire of high performance and quality.

The above and other objects, features and advantages of the present invention will become apparent from the following description and the appended claims, taken in conjunction with the accompanying drawings.

DETAILED DESCRIPTION OF THE INVENTION AND PREFERRED EMBODIMENTS

Figure 1:
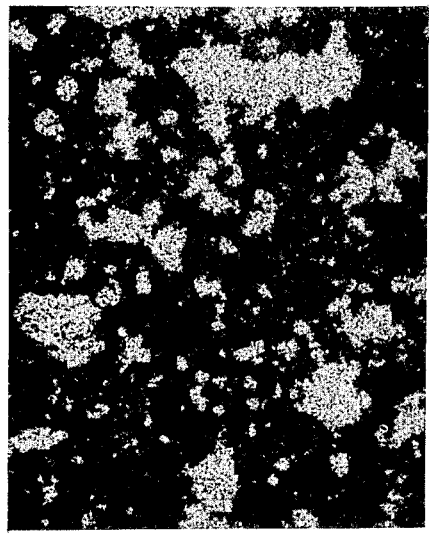
FIG. 1 is a picture of a characteristic X-ray image of Nb in a cross-section of an Nb-Cu green compact obtained in accordance with the method according to one embodiment of this invention, said X-ray image being obtained by an electron probe microanalyzer (EPMA)

As representative examples of the two kinds of metals which are capable of producing a compound pertaining superconducting characteristics through a reaction, there are mentioned a combination of Nb and Sn as well as another combination of V and Ga, the former producing $Nb_3Sn$ while the latter forming $V_3Ga$. The method of this invention can be applied to the production of each of $Nb_3Sn$ and $V_3Ga$, but the following description will be limited to the case of $Nb_3Sn$ only, for the sake of convenience.

It is preferred that the Nb to be employed in the method of this invention is very fine. When pure Nb powder is finely ground in a ball mill or the like, accompanied with an increase of the overall surface area and due to the generation of friction heat, more oxygen would be adsorbed on the surfaces of Nb particles and the Nb particles would be oxidized at the surfaces thereof, thereby deteriorating the workability of such Nb particles. Thus, in order to obtain Nb particles having good workability, Nb particles having a large particle size are heated in a flow of hydrogen gas to hydrogenate same, thereby forming brittle Nb powder. The thus-obtained brittle Nb powder is then ground until its mean particle size reaches about 50 $\mu$m or smaller, using suitable grinding means such as, for example, a disk mill or the like. As has already mentioned above, the thus-ground NbH was conventionally subjected to a heat treatment in vacuo so as to subject same to dehydrogenation annealing and to obtain very fine powder of pure Nb. According to the prior art method, the fine powder of pure Nb was generally mixed with copper powder and subjected to a press-forming. However, in the method of this invention, fine NbH powder is, without subjecting same to dehydrogenation, uniformly mixed with copper powder, the resulting powder mixture is subjected to press-forming and then to dehydrogenation annealing.

As copper powder to be employed in the method of this invention, it is preferred to use that produced by the so-called electrolysis method and having a particle size of 250 mesh or less and containing oxygen in an amount of 0.3% by weight or less. A preferable proportioning ratio of Nb powder to copper powder ranges, in weight ratio, from 10/90 to 40/60. If the amount of Nb is below the lower limit, less superconducting compound would be produced and the electric characteristics of a resulting product would be sacrificed. On the other hand, if too little copper is used, the physical or mechanical properties of a resulting wire would be deteriorated due to increased brittle superconducting phases and its electric properties would not be improved so much as expected from the increase of the superconducting phases. Therefore, it is not preferred to use Nb and Cu outside the above range. Both powders proportioned in an appropriate ratio are then mixed uniformly by means of powder mixing means commonly used in the art. Among conventional mixing means, the wet mixing making use of a ball mill is most preferable. The wet mixing is far more advantageous compared with other mixing methods, because a uniform mixing of both powder is achieved while the powders is ground further owing to the pulverizing action of the ball mill. As a solvent suitable for use in the wet mixing, a volatile organic solvent of a relatively low boiling point is preferred as it facilitates the drying of the powder mixture upon completion of the mixing operation. Needless to say, such a volatile organic solvent must be selected from those inert to both metal powders. As a typical example, acetone may be mentioned.

A powder mixture mixed uniformly in the above-described step is, after causing the solvent to dry off, then press-formed into a green compact of, for example, a billet shape under a pressure of at least 1000 atm, preferably, 1500 atm by means of a press-forming machine such as, for instance, rubber press. FIG. 1 is a picture of a characteristic X-ray image of Nb in a cross-section of a green compact obtained by the above press-forming, namely, an Nb-Cu green compact obtained by an electron probe microanalyzer (EPMA), as described above. Since the picture shows an image enlarged 400 times, it is appreciated how fine Nb powder is ground and how uniformly it is dispersed in the Cu-matrix. From this, is clearly envisaged the outstandingly distinct operational effect of the method of this invention.

The thus-obtained green compact is thereafter heated in vacuo to temperatures of from 750°–1000° C. and subjected to dehydrogenation annealing. In the step of annealing in vacuo the green compact of the intimately, uniformly dispersed and mixed NbH powder and Cu powder in the method of this invention, hydrogen which has been dehydrogenated from NbH and is still in the nascent state serves to reduce and deoxidize the oxidized surfaces of Cu powder, thereby converting the green compact into a green compact consisting practically of pure Nb powder and pure Cu powder. The above step can also bring about another outstanding operational effect whereby the green compact undergoes sintering at the same time. Namely, in a prior art method, NbH powder was subjected to dehydrogenation annealing as was. The resultant Nb powder was then mixed with Cu powder and, after press-forming the powder mixture, the resulting green compact was subjected to a sintering step. Contrary to such a prior art method, dehydrogenation annealing and sintering are applied to a green compact in a single step, according to the method of this invention. Accordingly, the present invention has advantages such that the production process has been considerably simplified and, while it was necessary in the prior art method to conduct the dehydrogenation annealing at a relatively low temperature and for a long period of time in order to prevent NbH powder from being sintered, the dehydrogenation annealing and sintering can be formed in a short period of time through a treatment at high temperatures since the annealing and sintering of the green compact are carried out simultaneously. In addition, in the prior art method, Nb powder and Cu powder, both of which have been subjected to reoxidation during their mixing step, are formed into a green compact as they are. On the contrary, Nb powder and Cu powder are subjected to dehydrogenation and deoxiation in the form of a green compact in the case of the method of this invention. Therefore, the resulting sintered mass contains oxygen and hydrogen in an extremely low proportion and has extremely good workability and reactivity.

The thus-obtained sintered mass is then subjected to a cold or hot isostatic extrusion in accordance with a commonly-employed method and subsequently drawn into a wire. Here, the sintered mass may be directly drawn into a wire if its annealing and sintering have proceeded to a sufficient level and its density has reached at least 80% of its true density. However, in order to assure a smoother drawing operation, it is preferred to subject in advance the sintered mass to a hot isostatic pressing treatment (hereinafter referred to as "HIP treatment") so that the sintered mass is densified practically to its true density. The HIP treatment is well-known as a technique to collapse voids present in a body to be treated and diffusion bond to thus-collapsed portions so as to densify its structure, by holding the body for a certain period of time in a gaseous atmosphere of a temperature and pressure sufficiently high to cause the body to undergo plastic deformation. Upon subjecting the above-described sintered body to the HIP treatment, it is necessary to seal the sintered body in vacuo in a container made of a metal such as copper and to hold it for at least about 1 to 2 hours or so at about 500°–850° C. and under a pressure of about 1000 atm or higher or preferably about 1500 atm or higher. The HIP treatment can provide a sintered mass whose density is substantially equal to the true density thereof. The resulting sintered body can be extremely easily drawn into a wire, and the workability as well as deformability and ductility of its Nb particles are extremely good.

The compositing of Nb with Sn (where vanadium is employed, gallium), which is a metal capable of forming a compound having superconducting characteristics through its reaction with Nb, is carried out either prior or subsequent to the above-described drawing work. Namely, after drawing the Nb-Cu sintered mass into a wire, a Sn plating may be applied onto the circumferential surface of the resulting wire. Alternatively, the Nb-Cu sintered mass may be covered, prior to drawing same into a wire, with an alloy containing Sn, for example, a Cu-Sn alloy(bronze) by covering the former with the latter, alternatively it is available that the Nb-Cu sintered mass may cover the Fn or the Fn-Cu alloy. The thus-covered sintered mass can then be drawn into a wire.

It is more preferable to perform the above compositing of Nb and Sn simultaneously with the densification step of the aforementioned sintered mass, i.e., with the densification by the HIP treatment. A method has already been described above to hermetically seal a sintered mass in vacuo in a metallic container and apply the HIP treatment thereto to densify the sintered mass. If a similar HIP treatment is conducted using a container made of an alloy containing Sn such as bronze, the high densification of the sintered mass and its composition with Sn can be attained simultaneously. Here, when the formation of Nb$_3$Sn proceeds through the reaction between Nb and Sn, the subsequent drawing work may be rendered difficult because of the brittleness of Nb$_3$Sn. Accordingly, care should be paid to maintain the HIP treatment temperature as low as possible in order to suppress the above-described reaction.

Upon subjecting the thus-obtained composite wire to a heat treatment at a temperature of about 500° C. or higher in accordance with a commonly-employed method, the following reaction takes place between Nb and Sn:

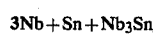

$$3Nb + Sn \rightarrow Nb_3Sn$$

Accordingly, a superconducting phase consisting of a structure of Nb$_3$Sn is formed in the matrix of Cu. Since highly reactive and pure and ultra-fine Nb is uniformly dispersed in an Nb-Cu wire obtained in accordance with the method of this invention, the superconducting phase is efficiently formed uniformly along the lengthwise direction of the wire. Thus, the thus-obtained superconducting wire exhibits excellent electrical characteristics. Furthermore, as its matrix is formed of Cu which is capable of retaining sufficient plastic strength, it also has excellent physical characteristics as a wire as well as mechanical properties such as flexibility, resiliency, deformability, ductility, tensile strength, etc.

Even in the above process, it is impossible to avoid the formation of Kirkendall voids in the wire due to the reaction of both metals through the heat treatment as mentioned above. In order to render various physical properties of the wire satisfactory, the superconducting wire obtained in the above method may preferably be subjected to a further HIP treatment so as to collapse Kirkendall voids and diffusion bond the thus-collapsed portions to densify same. As the HIP treatment temperature increases, it would become possible to cause plastic deformation of the superconducting wire at a lower gas pressure and to perform the diffusion bonding in a shorter period of time. However, needless to say, the temperature must be lower than the melting points of the raw materials Cu, Nb, V, etc. On the other hand, as the pressure goes higher, the plastic deformation can be caused to occur at a lower temperature. However, if a considerably high pressure is employed, the treatment apparatus requires a high degree of resistance to pressure and a long time is needed to raise the pressure of the treatment apparatus. Thus, it is desirous to limit the pressure as low as possible from a practical point of view. Where the matrix containing voids is formed of Cu or an alloy similar to Cu, the temperature may be above 550° C. but lower than the melting point of Cu or the alloy and the pressure may be at least 200 atm. Particularly, where the compound is $Nb_3Sn$, taking into consideration that the heat treatment temperature for causing the reaction between Nb and Sn to occur is generally above 500° C., it is expected to contribute to an improvement of the superconducting characteristics if the treatment temperature by the gas of high temperature and high pressure is 500° C. or higher, since the reaction between any unreacted Nb and Sn can proceeds in the course of the void elimination treatment, leading to an increase of the volume ratio of $Nb_3Sn$ in the superconducting wire.

As a gas constituting the atmosphere of a high temperature and pressure, it is preferable to use an inert gas which does not adversely affect the superconducting wire, for example, argon gas or the like. However, if it is desired to form an insulative oxide film on the surface of the superconducting wire, it is effective to add a small amount of oxygen into the inert gas.

Having generally described the invention, a more complete understanding can be obtained by reference to certain specific examples, which are provided herein for purposes of illustration only and are not intended to be limiting unless otherwise specified.

EXAMPLE 1

Commercially available Nb powder having a particle size of 60 mesh and containing oxygen and hydrogen respectively in amounts of 0.07% by weight and 0.002% by weight was hydrogenated in a flow of $H_2$ gas into NbH powder. It was pulverized by a disk mill to obtain fine NbH powder of a mean particle size of not greater than 50 μm. To 30 parts by weight of the thus-obtained fine NbH powder, was mixed 70 parts by weight of electrolytic Cu powder having a particle size of 250 mesh and contaning oxygen in an amount of 0.3% by weight. To the resulting powder mixture, was added acetone. Then, the mixture was subjected to wet mixing in a ball mill for 3 hours. After drying, the thus-obtained powder mixture was formed by a rubber press at a pressure of 2000 atm, thereby obtaining a billet-like green compact 30 mm in diameter and 100 mm in length. The green compact had a density which was about 80% of its true density. A picture of a characteristic X-ray image of Nb of its cross-section obtained by means of EPMA is shown in FIG. 1 of the present specification. As apparent from FIG. 1, Nb particles were uniformly dispersed in a very fine form throughout the green compact.

EXAMPLE 2

The green compact obtained in Example 1 was subjected to vacuum annealing at 850° C., for 15 hours, and at a pressure of $2 \times 10^{-6}$ Torr. An analysis on the resulting Nb-Cu sintered mass indicated a highly pure sintered Nb-Cu mass containing oxygen and hydrogen respectively in amounts of 0.07% by weight or less and 0.002% by weight or less.

EXAMPLE 3

Figure 2:
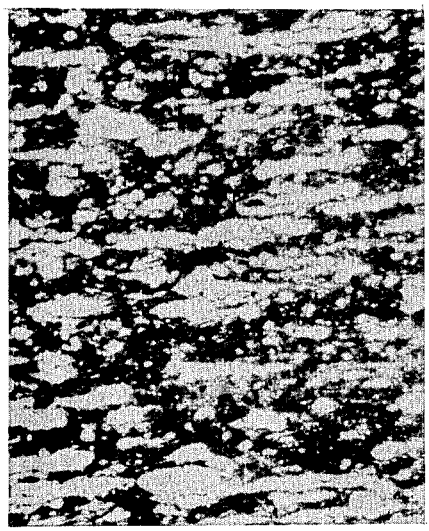
FIG. 2 is a photomicrograph of a cross-section of an extruded sintered mass obtained from the Nb-Cu green compact.

The sintered Nb-Cu mass resulting from Example 2 was sealed in vacuo in a container made of copper, thereby providing a billet ready for extrusion. After extruding the billet in accordance with the hot isostatic extrusion method (extrusion ratio: 10), it was drawn into a wire. The drawing work was smoothly carried out without developing any breakage. The deformability and ductility of Nb were good. FIG. 2 is a cross-sectional photomicroscope of the sintered Nb-Cu mass after its extrusion. It will be appreciated clearly that Nb particles are elongated sufficiently.

EXAMPLE 4

The Nb-Cu wire obtained in Example 3 was covered with bronze. A composite wire having an Nb-Cu wire in the matrix of bronze and a diameter of 0.5 mm was then subjected to a heat treatment at a temperature of 550° C. and for 72 hours, thereby forming a $Nb_3Sn$ phase around the Nb-Cu wire. Thus, a superconducting wire having electrically and mechanically excellent characteristics was obtained.

EXAMPLE 5

The procedure of Examples 1 and 2 were repeated. The thus-obtained sintered body, which had been subjected to dehydrogenation annealing, was sealed in vacuo in a container made of copper. It was then subjected to an HIP treatment at a temperature of 800° C. and a pressure of 1500 atm for 2.5 hours, providing a sintered mass having a density equivalent to its true density. When the sintered mass was subjected to a cold isostatic extrusion and drawn into a wire of 0.5 mm in diameter, the workability of Nb particles was improved further and was superb.

EXAMPLE 6

The Nb-Cu wire obtained in Example 5 was plated with Sn and thereafter subjected to a heat treatment at a temperature of 550° C. for 72 hours, thereby developing a $Nb_3Sn$ phase around the Nb-Cu wire. An microscopic observation of a cross-section thereof showed a number of very fine voids in the matrix. The above wire containing those fine voids was subjected to a HIP treatment for 2 hours in an Ar gas atmosphere of 700° C. and 1000 atm, thereby providing a dense superconducting wire in which the voids had been eliminated completely.

As described above in detail, according to the method of this invention, it is possible to obtain easily through rationalized steps a sintered mass of a high density in which ultra-fine particles of highly pure Nb or V are dispersed and contained uniformly in the matrix of Cu. As the sintered mass has excellent reactivity and workability, its drawing into a wire can be performed easily and, when it is composited with a metal capable of forming a superconducting compound through its reaction with Nb or V and then subjected to a heat treatment, the high purity and dispersion as well as fine particle size of Nb or V promote the progress of the reaction, thereby increasing the volume ratio of the superconducting compound to be produced and providing a superconducting wire having both of excellent electrical characteristics and mechanical characteristics, which were not available conventionally. If Kirkendall voids formed in the wire are eliminated by an HIP treatment to densify the wire, its mechanical and electrical characteristics will be improved still further. If the HIP treatment temperature is set equal to the heat treatment temperature for the formation of the compound, materials not reacted during the heat treatment can be reacted to each other, thereby proceeding the formation of the compound further and improving the superconducting characteristics. Accordingly, the present invention is believed to contribute considerably to the actual use and popularization of compound-type superconducting wires.

Having now fully described the invention, it will be apparent to one of ordinary skill in the art that many changes and modifications can be made thereto without departing from the spirit or scope of the invention as set forth herein.

What is claimed is:

1. A method for producing a compound-type superconducting wire including forming a wire containing two kinds of metals which are, upon a reaction therebetween, capable of forming a compound pertaining superconducting characteristics and subjecting said wire to a heat treatment so as to cause said reaction to occur, said method comprising the steps of:
   (i) mixing powder of the hydride of one of said two kinds of metals uniformly with copper powder and forming under pressure a resulting powder mixture into the green compact;
   (ii) heating said green compact in vacuo so as to subject said hydride to dehydrogenation annealing, thereby forming a sintered mass;
   (iii) drawing said sintered mass into a wire and compositing said wire with the other metal of said two kinds of metals to form a composite wire, or, alternatively, compositing said sintered mass with the other metal of said two kinds of metals and drawing a resulting composite sintered mass into a composite wire; and
   (iv) subjecting said composite wire to a heat treatment to cause said reaction to occur between said two kinds of metals.

2. The method as claimed in claim 1, wherein said sintered mass is, prior to being drawn into the wire, hermetically sealed in a metallic container and then subjected to a hot isostatic pressing treatment so as to densify said sintered mass further.

3. The method as claimed in claim 1, wherein step (iii) comprises drawing said sintered mass into said wire and plating the other metal of said two kinds of metals on the circumferential surface of said wire.

4. The method as claimed in claim 1, wherein step (iii) comprises covering the outer surfaces of said sintered mass with a metallic material containing the other metal of said two kinds of metals and then drawing the thus-covered sintered mass into said composite wire.

5. The method as claimed in claim 1, wherein step (iii) comprises hermetically sealing said sintered mass in a container formed of a metallic material containing the other metal of said two kinds of metals, subjecting the thus-sealed sintered mass to a hot isostatic pressing treatment, thereby performing both densification of said sintered mass and compositing of said sintered mass with the other metal, and then drawing a resulting composite mass into the composite wire.

6. The method as claimed in any one of claims 1 to 5, wherein said compound having said superconducting characteristics is $Nb_3Sn$ and said powder of the hydride of said one of said two kinds of metals, which powder is mixed with said copper powder, is powder of hydrogenated Nb.

7. The method as claimed in any one of claims 1 to 5, wherein said compound having said superconducting characteristics is $V_3Ga$ and said powder of the hydride of said one of said two kinds of metals, which powder is mixed with said copper powder, is powder of hydrogenated V.

8. The method as claimed in any one of claims 1 to 5, wherein said powder of said hydride has a mean particle size of not greater than about 50 $\mu$m.

9. The method as claimed in any one of claims 1 to 5, wherein said powder of said hydride and said copper powder are mixed in a ratio of 10–40 parts by weight to 90–60 parts by weight.

10. The method as claimed in claim 1, wherein said powder of said hydride and said copper powder are mixed in a volatile organic solvent.

11. The method as claimed in claim 10, wherein said volatile organic solvent is acetone.

12. The method as claimed in claim 10 or 11, wherein said powder of said hydride and said copper powder are mixed in a ball mill.

13. A method for producing a compound-type superconducting wire including forming a wire containing two kinds of metals which are, upon a reaction therebetween, capable of forming a compound having superconducting characteristics and subjecting said wire to a heat treatment so as to cause said reaction to occur, said method comprising the steps of:
   (i) mixing powder of the hydride of one of said two kinds of metals uniformly with copper powder and forming under pressure a resulting powder mixture into a green compact;
   (ii) heating said green compact in vacuo so as to subject said hydride to dehydrogenation annealing, thereby forming a sintered mass;
   (iii) drawing said sintered mass into a wire and compositing said wire with the other metal of said two kinds of metals to form a composite wire, or, alternatively, compositing said sintered mass with the other metal of said two kinds of metals and drawing a resulting composite sintered mass into a composite wire;
   (iv) subjecting said composite wire to a heat treatment to cause said reaction to occur between said two kinds of metals, thereby forming a compound-type superconducting wire; and (v) holding said superconducting wire for a predetermined period of time in a gaseous atmosphere of a temperature and pressure sufficiently high to cause said superconducting wire to undergo plastic deformation, thereby collapsing voids developed in the superconducting wire during said reaction, diffusion bonding the thus-collapsed portions and densifying the superconducting wire.

14. The method as claimed in claim 13, wherein step (v) comprises holding said superconducting wire obtained in step (iv) in a gaseous atmosphere of a temperature of at least 500° C. and a pressure of at least 200 atm for 30 minutes or longer.

15. The method as claimed in claim 13, wherein said sintered mass is, prior to being drawn into the wire, hermetically sealed in a metallic container and then subjected to a hot isostatic pressing treatment so as to densify said sintered mass further.

16. The method as claimed in claim 13, wherein step (iii) comprises drawing said sintered mass into said wire and plating the other metal of said two kinds of metals on the circumferential surface of said wire.

17. The method as claimed in claim 13, wherein step (iii) comprises covering the outer surfaces of said sintered mass with a metallic material containing the other metal of said two kinds of metals and then drawing the thus-covered sintered mass into said composite wire.

18. The method as claimed in claim 13, wherein step (iii) comprises hermetically sealing said sintered mass in a container formed of a metallic material containing the other metal of said two kinds of metals, subjecting the thus-sealed sintered mass to a hot isostatic pressing treatment, thereby performing both densification of said sintered mass and compositing of said sintered mass with the other metal, and then drawing a resulting composite mass into the composite wire.

19. The method as claimed in any one of claims 13 to 18, wherein said compound having said superconducting characteristics is $Nb_3Sn$ and said powder of the hydride of said one of said two kinds of metals, which powder is mixed with said copper powder, is powder of hydrogenated Nb.

20. The method as claimed in any one of claims 13 to 18, wherein said compound having said superconducting characteristics is $V_3Ga$ and said powder of the hydride of said one of said two kinds of metals, which powder is mixed with said copper powder, is powder of hydrogenated V.

21. The method as claimed in any one of claims 13 to 18, wherein said powder of said hydride has a mean particle size of not greater than about 50 $\mu$m.

22. The method as claimed in any one of claims 13 to 18, wherein said powder of said hydride and said copper powder are mixed in a ratio of 10–40 parts by weight to 90–60 parts by weight.

23. The method as claimed in claim 13, wherein said powder of said hydride and said copper powder are mixed in a volatile organic solvent.

24. The method as claimed in claim 23, wherein said volatile organic solvent is acetone.

25. The method as claimed in claim 23 or 24, wherein said powder of said hydride and said copper powder are mixed in a ball mill.

26. The method as claimed in claim 2 or 15, wherein said metallic container is made of copper.

27. The method as claimed in claim 1 or 13, wherein, in step (i), said resulting powder mixture is subjected to rubber press-forming to obtain said green compact.

* * * * *

UNITED STATES PATENT AND TRADEMARK OFFICE
CERTIFICATE OF CORRECTION

PATENT NO.   :   4,386,970
DATED        :   June 7, 1983
INVENTOR(S)  :   Toshiro Fukutsuka et al It is certified that error appears in the above-identified patent and that said Letters Patent is hereby corrected as shown below:

Column 1, line 27, in the formula, change "3Nb + Sn + $Nb_3Sn$" to -- 3Nb + Sn $\rightarrow$ $Nb_3Sn$ --.

Column 4, lines 64 and 65, change "powder" to -- powders --.

Column 5, line 57, change "deoxiation" to -- deoxidation --.

Column 6, line 36, change "Fn" to -- Sn -- (both occurrences).

Column 6, line 61, in the formula, change "3Nb + Sn + $Nb_3Sn$" to -- 3Nb + Sn $\rightarrow$ $Nb_3Sn$ --.

Column 8, line 49, in Example 5, change "procedure" to -- procedures --.

Column 9, line 49, change "a" to -- the --.

Column 9, line 50, change "the" to -- a --.

*Signed and Sealed this*

*Twenty-fifth* Day of *June 1985*

[SEAL]

*Attest:*

DONALD J. QUIGG

*Attesting Officer*   *Acting Commissioner of Patents and Trademarks*